US012587174B2

(12) United States Patent
Shen et al.

(10) Patent No.: US 12,587,174 B2
(45) Date of Patent: Mar. 24, 2026

(54) CONVERTING A DIGITAL SIGNAL FROM A FIRST SAMPLING RATE TO A SECOND SAMPLING RATE

(71) Applicant: LitePoint Corporation, San Jose, CA (US)

(72) Inventors: Nathan Daniel Shen, Sunnyvale, CA (US); Christian Morsing, Smyrna, TN (US); Carsten Andersen, San Francisco, CA (US)

(73) Assignee: LitePoint Corporation, San Jose, CA (US)

( * ) Notice: Subject to any disclaimer, the term of this patent is extended or adjusted under 35 U.S.C. 154(b) by 0 days.

(21) Appl. No.: 18/386,710

(22) Filed: Nov. 3, 2023

(65) Prior Publication Data

US 2025/0150060 A1 May 8, 2025

(51) Int. Cl.
  *H03M 7/40* (2006.01)
  *H03H 17/02* (2006.01)
  *H03H 17/06* (2006.01)

(52) U.S. Cl.
  CPC .... *H03H 17/0621* (2013.01); *H03H 17/0226* (2013.01)

(58) Field of Classification Search
  CPC ..................... H03H 17/0621; H03H 17/0226
  USPC .......................................................... 341/61
  See application file for complete search history.

(56) References Cited

U.S. PATENT DOCUMENTS 6,057,793 A     5/2000   Gong et al.
7,167,682 B1    1/2007   Madsen et al.

7,236,110 B2    6/2007   Antonesei
7,363,188 B1    4/2008   Olgaard et al.
7,457,712 B1    11/2008  Madsen et al.
7,457,995 B1    11/2008  Madsen et al.
7,772,922 B1    8/2010   Olgaard et al.
7,970,088 B2    6/2011   Chieng et al.
(Continued)

FOREIGN PATENT DOCUMENTS

CN       1819457 B      9/2012
CN       105991137 B    10/2016
EP       2533057 B1     4/2024

OTHER PUBLICATIONS

"Aliasing," Wikipedia [online] Retrieved from URL: https://en.wikipedia.org/wiki/Aliasing (Jan. 2, 2024), 4 pages.

(Continued)

*Primary Examiner* — Jean B Jeanglaude
(74) *Attorney, Agent, or Firm* — ArentFox Schiff LLP

(57) ABSTRACT

An example system is configured to convert a first digital signal having a first sampling rate into a second digital signal having a second sampling rate that is different from the first sampling rate. The system includes an input circuit to receive the first digital signal at the first sampling rate; a fractional finite impulse response (FIR) circuit configured to shift the first digital signal by a value corresponding coefficients of the FIR circuit, with the value being based on an integer value or a non-integer value; memory to store the coefficients for the FIR circuit; and processing circuitry to receive information corresponding to the second sampling rate, to obtain the value based on the information, to obtain the coefficients from the memory based on the value, and to provide the coefficients to the FIR circuit.

25 Claims, 3 Drawing Sheets

(56) References Cited

U.S. PATENT DOCUMENTS

| | | | |
|---|---|---|---|
| 8,078,100 B2 | 12/2011 | Proctor, Jr. et al. | |
| 8,189,483 B2 | 5/2012 | Olgaard et al. | |
| 8,377,054 B2 | 2/2013 | Gilbert | |
| 8,405,532 B1 | 3/2013 | Clark et al. | |
| 8,782,109 B2 | 7/2014 | Tsutsui | |
| 8,872,678 B2 | 10/2014 | Jonsson et al. | |
| 9,385,762 B2 | 7/2016 | Laporte et al. | |
| 9,667,229 B1 | 5/2017 | Per Ekstrand | |
| 9,794,009 B1 | 10/2017 | Olgaard et al. | |
| 2007/0257711 A1* | 11/2007 | Waki | H03H 17/0621 |
| | | | 327/105 |
| 2009/0128379 A1* | 5/2009 | Rosenthal | H03H 17/0685 |
| | | | 341/61 |
| 2010/0007355 A1 | 1/2010 | Olgaard et al. | |
| 2010/0056201 A1* | 3/2010 | Akamine | H04B 1/0017 |
| | | | 375/220 |
| 2011/0216856 A1* | 9/2011 | Poklemba | H04L 27/00 |
| | | | 375/340 |
| 2011/0314333 A1 | 12/2011 | Olgaard et al. | |
| 2012/0051407 A1 | 3/2012 | Ji et al. | |
| 2012/0213112 A1 | 8/2012 | Olgaard et al. | |
| 2013/0326290 A1 | 12/2013 | Elserougi et al. | |
| 2015/0372764 A1* | 12/2015 | Kaneda | H04B 10/616 |
| | | | 398/115 |
| 2016/0277007 A1 | 9/2016 | Tangudu et al. | |
| 2023/0198506 A1 | 6/2023 | Ponnapureddy et al. | |

OTHER PUBLICATIONS

Alterra Corporation, "Designing Polyphase DPD Solutions with 28-nm FPGAs," White Paper WP-01171-1.0 (2012), 20 pages.

Barker, D., "Efficient Resampling Implementations [DSP Tips & Tricks]," IEEE Signal Processing Magazine, vol. 25, iss. 4, pp. 114-117 (2008), 4 pages.

Blok, M., "Fractional Delay Filter Design for Sample Rate Conversion," Proc. Of the Federated Conf on Computer Science and Information Systems, pp. 701-706 (2012), 6 pages.

Blok et al., "Variable Ratio Sample Rate Conversion Based on Fractional Delay Filter," Archives of Acoustics, vol. 39, No. 2, pp. 231-242 (2014), 12 pages.

Caffee, S., "Continuously Variable Fractional Rate Decimator," Xilinx, XAPP936 (v1.1) Application Note: Virtex-5, Virtex-4, Spartan-3 (Mar. 5, 2007), 11 pages.

Canese et al., "Efficient Digital Implementation of a Multirate-Based Variable Fractional Delay Filter for Wideband Beamforming," IEEE Trans on Circuits and Systems—II: Express Briefs, vol. 70, No. 6, gps. 2231-2235 (2023), 5 pages.

Cho et al., "Design of a Sample-Rate Converter From CD to DAT Using Fractional Delay Allpass Filter," IEEE Transactions on Circuits and Systems II: Express Briefs, vol. 54, pp. 19-23, DOI: 10.1109/TCSII.2006.885067 (2007), 5 pages.

Datta et al., "FPGA Implementation of Symmetric Systolic FIR Filter using Multi-channel Technique," IEEE VLSI Device, Circuit & System Conference (VLSI-DCS) Jul. 18-19, 2020, ED MSIT SBC, Kolkata, India, pp. 225-228 (2020), 4 pages.

De Soras, L., "The Quest for the Perfect Resampler," [online] Retrieved from <URL: http://ldesoras.free.fr> (2005), 28 pages.

Dick, C., "Options for Arbitrary Resamplers in FPGA-Based Modulators," Conference Record of the Thirty-Eighth Asilomar Conference on Signals, Systems and Computers, Pacific Grove, CA, USA, pp. 777-781, vol. 1, DOI: 10.1109/ACSSC.2004.1399241 (2004), 5 pages.

"Finite Impulse Response," Wikipedia [online] Retrieved from URL: https://en.wikipedia.org/wiki/Finite_impulse_response (Jan. 2, 2024), 6 pages.

Schaumont, P., "FIR Implementation Techniques," Worcester Polytechnic Institute, Worcester, MA, Lecture 2, ECE 4703, B Term [online] Retrieved from <URL: https://schaumont.dyn.wpi.edu/ece4703b21/lecture2.html> (2021), 13 pages.

Jin et al., "Evaluation of the FIR Example using Xilinx Vivado High-Level Synthesis Compiler," Argonne Leadership Computing Facility, Argonne National Laboratory, ANL/ALCF-17/6, (2017), 9 pages.

Johansson et al., "Adjustable Fractional-Delay FIR Filters Using the Farrow Structure and Multirate Techniques," APCCAS 2006—2006 IEEE Asia Pacific Conference on Circuits and Systems, Singapore, pp. 1055-1058, doi: 10.1109/APCCAS.2006.342270 (2006), 4 pages.

Jorgovanovic et al., "FPGA Design of Arbitrary Down-sampler," Proc. 26th Intl Conf on Microelectronics (MIEL 2008), Nis, Serbia, May 11-14, 2008, pp. 391-394 (2008), 4 pages.

Markovic et al., "FPGA Realization of Farrow Structure for Sampling Rate Change," Serbian Journal of Electrical Engineering, vol. 13, No. 1, pp. 83-93 (2016), 11 pages.

"Design Fractional Delay FIR Filters," Mathworks [online] Retrieved from <URL:https://www.mathworks.com/help/dsp/ug/design-of-fractional-delay-fir-filters.html>, retrieved on Feb. 8, 2024 © 1994-2024 The MathWorks, Inc., 15 pages.

"Dsp.SampleRateConverter," Mathworks [online] Retrieved from <URL:https://www.mathworks.com/help/dsp/ref/dsp.samplerateconverter-system-object.html>, retrieved on 2024-02-08 © 1994-2024 The MathWorks, Inc., 15 pages.

"HDL Sample Rate Conversion Using Farrow Filters," Mathworks [online] Retrieved from <URL:https://www. mathworks.com/help/hdlfilter/hdl-sample-rate-conversion-using-farrow-filters.html>, retrieved on Feb. 8, 2024 © 1994-2024 The MathWorks, Inc., 4 pages.

"Programmable FIR Filter for FPGA," Mathworks [online] Retrieved from <URL:https://www.mathworks.com/help/dsp/ug/generate-hdl-code-for-programmable-fir-filter.html>, retrieved on Feb. 8, 2024 © 1994-2024 The MathWorks, Inc., 15 pages.

Nagrale, N. R., "Systems for Fractional Sampling Rate Conversion," Dissertation Submitted to Program in Electronics, Dept. of Electronics, National Inst. Of Astrophysics, Optics, and Electonics (Jul. 2007), 144 pages.

Putnam et al., "Design of Fractional Delay Filters Using Convex Optimization," Proc of 1997 Workshop on Applications of Signal Processing to Audio and Acoustics, New Paltz, NY, USA, 1997, pp. 4-7, DOI: 10.1109/ASPAA.1997.625616 (1997), 4 pages.

Rajamani et al., "An efficient algorithm for sample rate conversion from CD to DAT," IEEE Signal Processing Letters, vol. 7, No. 10, pp. 288-290, DOI: 10.1109/97.870683 (2000), 3 pages.

"LabVIEW Digital Filter Design Toolkit API Reference—Rational Sesampler Toolkit (Digital Filter Design Toolkit)," Natl Inst Corp, div of Emerson's Test & Measurement Group [online] Retrieved from the Internet <URL: https://www.ni.com/docs/en-US/bundle/labview-digital-filter-design-toolkit-api-ref/page/lvdfdtconcepts/rational_resampling.html> (Jan. 2024), 2 pages.

Richard, W., "Efficient Parallel Real-Time Upsampling with Xilinx FPGAs," Xplanation: FPGA 101, Xcell Journal, Retrieved from <URL:https://www.xilinx.com/publications/xcellonline/efficient-parallel-real-time-upsampling-with-xilinx-fpgas.pdf>, pp. 39-44 (2014), 7 pages.

Robertson, N., "Fractional Delay FIR Filters," [online] Retrieved from the Internet: <URL:https://www.dsprelated.com/showarticle/1327.php>, Retrieved on Feb. 8, 2024 (Feb. 9, 2020), 15 pages.

"Sample Rate Conversion," Android.com [online] Retrieved from <URL: https://source.android.com/docs/core/audio/src#:~:text=This%20article%20describes%20sample%20rate,at%20a%20different%20sample%20rate> (Jan. 2024), 2 pages.

"Sample-rate conversion," Wikipedia [online] Retrieved from URL: https://en.wikipedia.org/wiki/Sample-rate_conversion (Jan. 2, 2024), 3 pages.

Schmid, M., "FPGA FIR-Filter / HLS / Kria KV260 / Pynq: Designing a fully pipelined and parallel FIR filter with float and fixed-point datatype. Using the Kria KV260 FPGA, HLS and Pynq," [online] Retrieved from <URL: https://www.hackster.io/michi_michi/fpga-fir-filter-hls-kria-kv260-pynq-2eec35>, retrieved on Feb. 8, 2024 (2022), 5 pages.

Smith, III, J., "What is Bandlimited Interpolation?" The Digital Audio Resampling Home Page, Center for Computer Research in Music and Acoustics (CCRMA), Stanford Univ., (© 2020), Retrieved from <URL: https://ccrma.stanford.edu/~jos/resample/What_Bandlimited_Interpolation.html> retrieved on Feb. 8, 2024, 1 page.

(56) References Cited

OTHER PUBLICATIONS

Smith, J., "The Digital Audio Resampling Home Page," URL: https://ccrma.stanford.edu/~jos/resample/ (2020), 2 pages.

Smith, J., MUS420, Lecture 4A, "Interpolated Delay Lines, Ideal Bandlimited Interpolation, and Fractional Delay Filter Design," Center for Computer Research in Music and Acoustics (CCRM), Department of Music, Stanford University, Stanford, CA (2022), 31 pages.

Smith et al., MUS421/EE367B, Lecture 9, "Multirate, Polyphase, and Wavelet Filter Banks," Scott Levine and Harvey Thornburg Center for Computer Research in Music and Acoustics (CCRMA), Dept. of Music, Stanford University, Stanford, CA (2020), 48 pages.

Smith, III, J., Physcial Audio Signal Processing: Table Look-Up, [online] Retrieved from the Internet: <URL: https://ccrma.stanford.edu/~jos/pasp/Table_Look_Up.html>, retrieved on Jul. 8, 2023 ( © 2022), 1 page.

Tietche et al., "A Practical FPGA-Based Architecture for Arbitrary-Ration Sample Rate Conversion," J. Sign Process Syst 78:147-154 (2015), 8 pages.

Tseng et al., "Design of Wideband Fractional Delay Filters Using Derivative Sampling Method," IEEE Trans on Circuits and Systems—I: Regular Papers, vol. 57, No. 8, pp. 2087-2098 (2010), 12 pages.

Vesma et al., "Polynomial-Based Interpolation Filters—Part I: Filter Synthesis," Circuits Systems Signal Processing, vol. 26, No. 2, pp. 115-146 (2007), 32 pages.

Xilinx, Application Note: Versal AI Core Devices, "Arbitrary Resampling Filter Design," XAPP1373 (v1.0), (2022), 16 pages.

Xilinx "FIR Compiler v7.2: LogiCORE IP Product Guide, Vivado Design Suite," p. 149 (2022), 134 pages.

"frac_resampler_dn_v2", SysGen 9.1i Fractional Resampler Dn, Mar. 2, 2007, 174 pages.

"frac_resampler_up_v2", SysGen 9.1i Fractional Resampler Up, Mar. 2, 2007, 139 pages.

"System Generator for DSP—User Guide", www.xilinx.com, Apr. 2008, (350 pages).

Shahabuddin, et al. "A Fractional Sample Rate Converter with Parallelized Multiphase Output: Algorithm and FPGA Implementation", J. of Signal Processing Systems (2022) 94: pp. 1459-1469.

* cited by examiner

CONVERTING A DIGITAL SIGNAL FROM A FIRST SAMPLING RATE TO A SECOND SAMPLING RATE

TECHNICAL FIELD

This specification describes example implementations of a system for converting a digital signal from a first sampling rate to a second sampling rate.

BACKGROUND

Sample rate conversion is a process of changing a first digital signal having first sampling rate into a second digital signal having a second sampling rate that is different from the first sampling rate. Sample rate conversion may be performed for a variety of reasons. For example, sample rate conversion may be performed to comply with the sampling rates required by different protocols such as WiFi and 5G. An example resampler includes a device or system for performing sample rate conversion.

SUMMARY

An example system is configured to convert a first digital signal having a first sampling rate into a second digital signal having a second sampling rate that is different from the first sampling rate. The system includes an input circuit to receive the first digital signal at the first sampling rate; a fractional finite impulse response (FIR) circuit configured to shift the first digital signal by a value corresponding coefficients of the FIR circuit, with the value being based on an integer value or a non-integer value; memory to store the coefficients for the FIR circuit; and processing circuitry to receive information corresponding to the second sampling rate, to obtain the value based on the information, to obtain the coefficients from the memory based on the value, and to provide the coefficients to the FIR circuit. The FIR circuit is configured to convert the first digital signal to the second digital signal by shifting the first digital signal based on the value and by performing processing on the first digital signal as shifted based on the coefficients to convert the first digital signal into the second digital signal. The example system may include one or more of the following features, either alone or in combination.

The processing performed by the FIR circuit on the first digital signal may include interpolation. The processing circuitry may include a phase accumulator. The phase accumulator may be configured to determine multiple values, including the value, based on the information. Each of the multiple values may correspond to coefficients of the FIR circuit. The FIR circuit may be configured to convert the first digital signal to the second digital signal by shifting the first digital signal based on each of multiple values and by performing processing on the first digital signal as shifted based on coefficients corresponding to each of the multiple values to convert the first digital signal into the second digital signal. The phase accumulator may be configured to obtain values after a first value by summing multiple preceding ones of the values. Each value may be a truncated version of a number. The number may contain digits that are not in each value. The processing circuitry may be configured to add an error to at least one of the values after the first value based on digits in the number. The error may be added to each $N^{th}$ value, where N is an integer greater than one. The memory may include a look-up table (LUT). The LUT may be for storing the coefficients. The coefficients may be among sets of coefficients stored in the memory to implement different sampling rates. The coefficients may include a set of coefficients. A number of coefficients in the set may be based on the second sampling rate.

The system may include a circuit configured to output the first digital signal to the FIR circuit based on the information. The system may include multiple FIR circuits, including the FIR circuit. The multiple FIR circuits may be configured to operate in parallel. The first sampling rate may be less than the second sampling rate. The second sampling rate may be less than the first sampling rate. Coefficients from the set may be obtained, and provided to the FIR circuit, based on the second sampling rate.

A field-programmable gate array (FPGA) may include or implement the system. An application-specific integrated circuit may include or implement the system.

An example method is for converting a first digital signal having a first sampling rate into a second digital signal having a second sampling rate that is different from the first sampling rate. The method includes receiving the first digital signal at the first sampling rate; receiving information corresponding to the second sampling rate; obtaining a value based on the information, with the value being based on an integer value or a non-integer value; obtaining coefficients based on the value; and a fractional FIR circuit shifting the first digital signal based on the value, and performing processing on the first digital signal as shifted based on the coefficients to convert the first digital signal into the second digital signal. The example method may include one or more of the following features either alone or in combination.

The processing performed by the FIR circuit on the digital signal may include interpolation. Obtaining the value may include determining multiple values, including the value, using a phase accumulator based on the information. Each of the multiple values may correspond coefficients of the FIR circuit. The FIR circuit may shift the first digital signal based on each of multiple values and perform processing on the first digital signal as shifted based on coefficients corresponding to each of the multiple values to convert the first digital signal into the second digital signal.

The phase accumulator may obtain values after a first value by summing multiple preceding ones of the values. Each value may be a truncated version of a number. The number may contain digits that are not in each value. The method may include adding an error to at least one of the values after the first value based on digits in the number. The error may be added to each $N^{th}$ value, where N is an integer greater than one. The coefficients may be obtained from memory storing coefficients.

The method may include causing the first digital signal to be output to the FIR circuit based on the information. The method may include multiple FIR circuits, including the FIR circuit, with the multiple FIR circuits operating in parallel. The first sampling rate may be less than the second sampling rate. The second sampling rate may be less than the first sampling rate. The coefficients may include a set of coefficients. Coefficients from the set may be obtained, and provided to the FIR circuit, based on the second sampling rate.

Any two or more of the features described in this specification, including in this summary section, may be combined to form implementations not specifically described in this specification.

At least part of the devices, circuitry, systems, techniques, and processes described in this specification may be implemented or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, circuitry, systems, techniques, and processes described in this specification may be implemented or controlled using a computing system comprised of one or more processing devices and memory storing instructions that are executable by the one or more processing devices to perform various control operations. The devices, circuitry, systems, techniques, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

A example resampler includes a device or system configured convert a first digital signal having an initial (first) sampling rate into a second digital signal having a resampling (second) rate that is different from the initial (first) sampling rate. In this specification, first and second are merely used to distinguish between the two digital signals and are not indicative of a temporal or other relationship between the signals.

Example implementations of the resamplers described herein may be or include fractional-delay resamplers having independent and scalable bandwidth, aliasing, and sampling frequency resolution. The example resamplers may be configured to perform upsampling, in which the sampling rate of the first digital signal is increased to produce the second digital signal. The example resamplers described herein may be configured to perform downsampling, in which the sampling rate of the first digital signal is decreased to produce the second digital signal.

Figure 1:
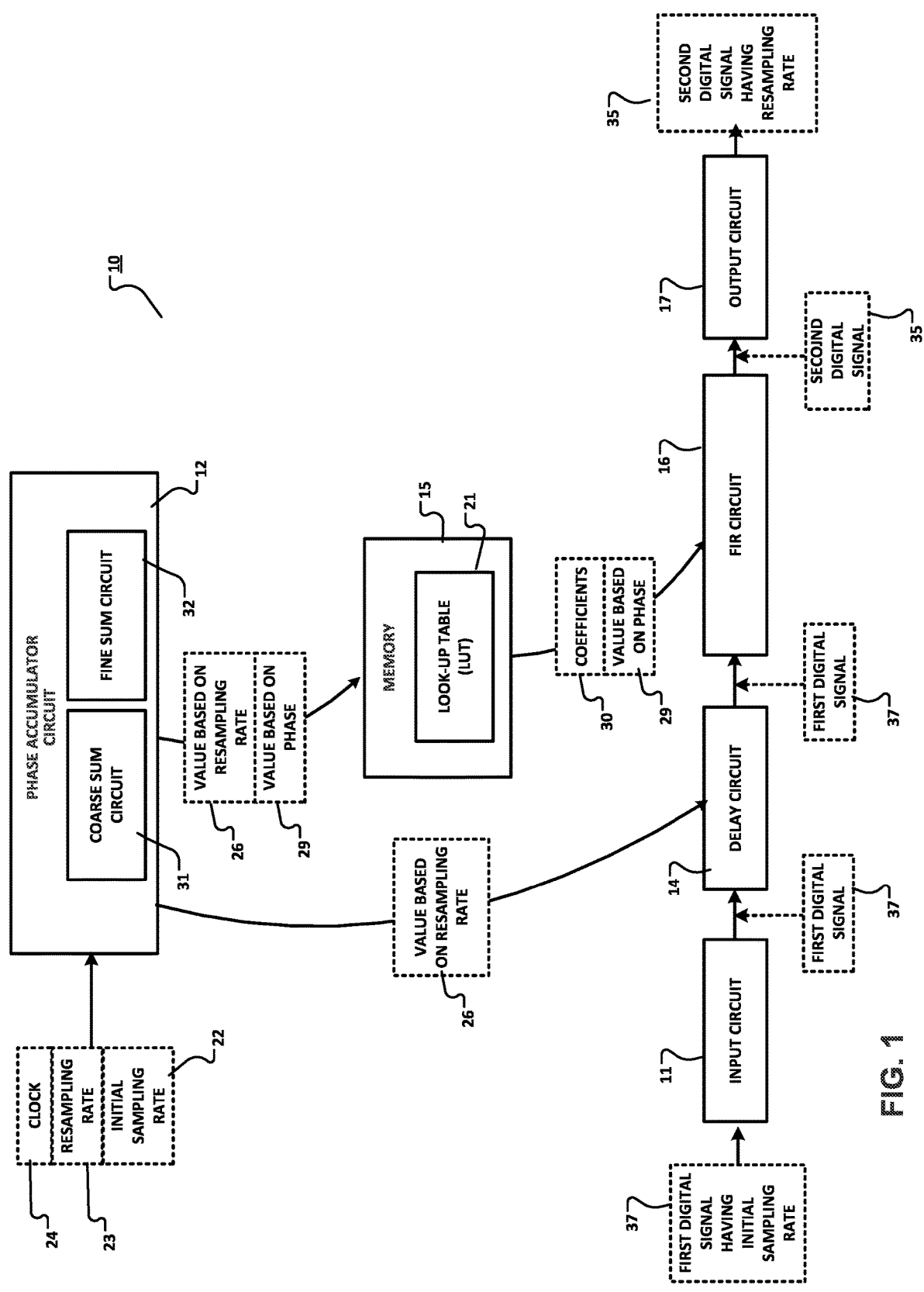
FIG. 1 is a block diagram of an example resampler circuit.

FIG. 1 shows a configuration of an example resampler 10 of the type described above. All or part of resampler 10 may be implemented using processing circuity including, for example, programmable logic such as a field programmable gate array (FPGA), an application-specific integrated circuit (ASIC), discrete circuit and/or logic components, one or more processing devices programmed with executable instructions to perform the functions described herein, or any appropriate combination of electronics.

Example resampler 10 includes input circuit 11, phase accumulator circuit 12 (or, simply, "phase accumulator 12"), delay circuit 14, memory 15, finite impulse response (FIR) circuit 16, and output circuit 17. Input circuit 11 is configured to receive the first digital signal having an initial (first) sampling rate, which is to be converted into a second digital signal having a resampling (second) rate that is different from the initial sampling rate. Input circuit 11 may include, for example, a connection to a bus, such as serial bus over which the first digital signal is received, and one or more buffers.

Delay circuit 14 may include one or more buffers or other memory to store the first digital signal. For example, delay circuit 14 may include one or more first-in, first-out (FIFO) buffers. Delay circuit 14 is configured to receive the first digital signal from input circuit 11 and to store the first digital signal for output to FIR circuit 16. Delay circuit 14 is controllable by phase accumulator 12 to output the first digital signal a number of times. The number of times is based the resampling rate. For example, if the initial sampling rate of the first digital signal is 100 Megahertz (MHz) and the resampling rate is 400 MHz, then the first digital signal is to be upsampled by a factor of four. In other words, in this example, the number of samples in the first digital signal is to be increased by a factor of four to produce the second digital signal. In this case, delay circuit 14 is configured to output the same first digital signal four times to FIR circuit 16. The number of times that the first digital signal is output from delay circuit 14 may be determined by phase accumulator 12 or other processing circuity based on the number of additional samples needed to produce, from the first digital signal, the second digital signal having the resampling rate. If the first digital signal is to be downsampled, the first digital signal may be output one or more times.

FIR circuit 16 is a circuit whose impulse response or response to any finite length input is of finite duration because the response settles to zero in finite time. FIR circuit 16 may be hard-coded structure that performs fractional delay shifting on each instance of the first digital signal and that performs resampling on the shifted signals using coefficients that are loaded into the FIR circuit to obtain the second digital signal.

The amounts or values by which FIR circuit 16 shifts each instance of the first digital signal are obtained based on information about the resampling rate. These values may be or correspond to phase shifts to be performed in the first digital signal. For example, if the resampling rate is four times the initial sampling rate, then there may be four values by which the FIR circuit 16 shifts the first digital signal. In this example, the phase shifts are 0°, 90°, 180°, and 270°. In another example, if the resampling rate eight times the initial sampling rate, then there may be eight values by which the FIR circuit 16 shifts the first digital signal. In this example, the phase shifts are 0°, 45°, 90°, 135°, 180°, 225°, 270°, and 315°. The values are determined by phase accumulator 12 (see below) and are provided to FIR circuit 16 along with corresponding coefficients.

The coefficients programmed into FIR circuit 16 correspond to the sampling rate conversion to be performed on the first digital signal, and configure FIR circuit 16 to perform that sample rate conversion. For example, if the first digital signal is to be upsampled by a factor of four to produce the second digital signal, then the coefficients are specific to that amount of upsampling. In another example, if the first digital signal is to be upsampled by a factor of 5.5 to produce the second digital signal, then the coefficients are specific to that amount of upsampling. In some implementations, there may be a different set of coefficients for each phase of the resampling rate. For example, in the case of a resampling rate that is four times the initial sampling rate of the first digital signal, the coefficients may include a set of coefficients for 0°, a set of coefficients for 90°, a set of coefficients for 180°, and a set of coefficients for 270°.

The coefficients may be configured to cause FIR circuit 16 to produce resampling rates that are integer or non-integer multiples of the initial sampling rate. For example, the resampling rate may be two times the initial sampling rate, the resampling rate may be three times the initial sampling rate, the resampling rate may be four times the initial sampling rate, the resampling rate may be five times the initial sampling rate, and so forth. For example, the resampling rate may be 0.25 times the initial sampling rate, the resampling rate may be 0.5 times the initial sampling rate, the resampling rate may be 1.3 times the initial sampling rate, the resampling rate may be 2.8 times the initial sampling rate, the resampling rate may be 4.23 times the initial sampling rate, and so forth. Any integer or non-integer resampling multiple may be used, where the resampling multiple includes the factor by which the initial sampling rate is changed to produce the resampling rate (e.g., four, five, six, 0.25, 0.5, 1.3, etc.).

FIR circuit 16 is configured to perform polynomial interpolation for each shift of the first digital signal, examples of which are presented above, to obtain additional and/or substitute samples needed to resample the first digital signal to produce the second digital signal. In general, interpolation includes determining—for example, estimating—new data points based on a range of a discrete set of known data points. Polynomial interpolation uses a polynomial as an interpolant. Generally, if there are n (where n is an integer greater than one) data points, there is a polynomial of degree at most n−1 passing through the data points. The polynomial interpolation performed by FIR circuit 16 may be or include first order polynomial interpolation (linear interpolation), second order polynomial interpolation, third order polynomial interpolation, fourth order polynomial interpolation, and so forth.

In some implementations FIR circuit 16 fits a polynomial to the existing samples for each phase shift of the first digital signal and identifies additional and/or substitute samples along that polynomial. The number of additional and/or substitute samples corresponds to the resampling. For example, if there are 1000 existing samples in the first digital signal and the sampling rate is to be increased by a factor of four to produce the second digital signal, then 3000 additional samples are determined using FIR circuit 16 to make the total number of samples for 4000 in the second digital signal. If the first digital signal is to be downsampled then, in accordance with the resampling rate, one or more existing samples may be discarded and replaced with substitute samples from along the polynomial based on the resampling rate.

As noted above, FIR circuit 16 may be configured to perform polynomial interpolation for each phase shift of the first digital signal using coefficients based on the resampling multiple and a current phase shift of the first digital signal. In some examples, FIR circuit 16 is configured to identify the additional samples by viewing a window around existing samples in the first digital signal and by identifying, based on the polynomial interpolation performed by FIR circuit 16, one or more additional and/or substitute samples within that window to include in the second digital signal. In some implementation, the window is twelve samples before, and twelve samples after, the target sample; however, the window may be more or less than twelve samples before and after the target sample. The window may be symmetric, with the same number of samples before and after a target sample, or asymmetric with different numbers of samples before and after the target sample. For example, FIR circuit 16 may use fewer or greater numbers of samples before the target sample than after the target sample, or vice versa; e.g., FIR circuit 16 may use four samples before the target sample and sixteen samples after the target sample.

By way of example, for a target sample T (an existing sample) in the first digital signal, FIR circuit 16 views N (where N is an integer greater than or equal to one) existing samples in the first digital signal before and after the target sample T. The N samples may be samples in the first digital signal that immediately precede in sequence, and that and immediately follow in sequence, the target sample T. For example, if the first digital signals is as follows, where xi (i≥1) is a sample in sequence and T is the target sample also in the sequence, FIR circuit 16 may view existing samples x1 to x8 and x9 to x16.

x1, x2, x3, x4, x5, x6, x7, x8 T x9, x10, x11, x12, x13, x14, x15, x16

FIR circuit 16 processes the existing samples—for example, x1 to x8, T, and x9 to x16—within the window based on the polynomial interpolation that FIR circuit 16 applied to the samples in order to determine additional and/or substitute samples with which to form the second digital signal. FIR circuit 16 may do this by identifying one or more additional samples along the interpolant polynomial that are between adjacent existing samples, where the number of additional samples to be obtained between adjacent existing samples may be based on the resampling rate. In some cases, including but not limited to cases where FIR circuit 16 performs downsampling, FIR circuit 16 may identify, based on the resampling rate, any appropriate number of substitute samples along the interpolant polynomial which may, or may not, include the existing samples. These substitute samples may be used alone or in combination with all or some of the existing samples to produce the second digital signal having the resampling rate.

In some implementations, FIR circuit 16 processes every existing sample in the first digital signal in the foregoing manner in order to determine the additional and/or substitute samples with which to form the second digital signal. In some implementations, FIR circuit 16 processes a subset of samples in the first digital signal in the foregoing manner in order to determine the additional and/or substitute with which to form the second digital signal. For example, FIR circuit 16 may be configured to process every other existing sample or to process only existing samples within a specified part of the first digital signal in the foregoing manner.

FIR circuit 16 may be configured to combine the existing samples, the substitute samples, and/or the additional samples obtained at each phase shift to generate the second digital signal having the resampling rate that is different from the initial sampling rate. Output circuit 17 may perform this combining function and may output the second digital signal to a communications medium and/or to circuitry such as one or more processing devices for further processing (not shown). Output circuit 17 may include, for example, a connection to a bus, such as serial bus, one or more buffers and, in some implementations, processing circuitry to control combining the samples.

As shown in FIG. 1, the coefficients 30 for FIR circuit 16 described above may be stored in a database, such as a look-up table (LUT) 21 in memory 15. The coefficients may be loaded from this memory into FIR circuit 16 based on—for example, in response to—instructions and/or input from phase accumulator 12.

Phase accumulator 12 may include memory and one or more processing circuits of the type described herein and memory. Phase accumulator 12 is configured to receive the initial sampling rate 22 of the first digital signal and the resampling rate 23 and to provide the resampling rate or a value 26 based on that rate, such as the resampling multiple, to delay circuit 14. The resampling rate may correspond to a clock signal produced using a direct digital synthesis (DDS) clock, which clock signal may also be used to access the LUT. In an example, if the initial sampling rate is 100 MHz and the resampling rate is 400 MHz, then phase accumulator determines that the first digital signal is to be upsampled by a factor of four, which is the resampling multiple. This value represents the number of times that the same first digital signal is to be output from the delay circuit 12 to FIR circuit 16 during resampling.

Phase accumulator 12 is also configured to determine values—for example, the phases or values representing the phases—by which each instance of the first digital signal output by delay circuit 14 to FIR circuit 16 is to be shifted by FIR circuit 16. Phase accumulator 12 keeps track of the current phase by addition. For example, if the resampling rate is four times the initial sampling rate, each phase corresponds to a value of 0.25 (or ¼). At each phase change, the next phase is the sum of 0.25 and the value for the prior phase. Stated otherwise, phase accumulator 12 is configured to obtain values after a first value by summing multiple preceding ones of the values.

Phase accumulator 12 is also configured to use the resampling rate or a value 26 based on that rate, such as the resampling multiple, and the phases and/or values based thereon 29 to access the coefficients used to configure FIR circuit 16. More specifically, phase accumulator 12 determines the phases based on the resampling rate. In the example presented above, if the resampling rate is four times the initial sampling rate, then the phases may be 0°, 90°, 180°, and 270°. In this example, phase accumulator 12 uses the resampling multiple and the first phase, 0°, to access the LUT, to obtain a set of coefficients 30 for the resampling multiple of four and phase of 0°, and to configure FIR circuit 16 with that set of coefficients for the 0° phase shift. Phase accumulator 12 also provides FIR circuit 16 with information 29 representing the phase of 0° so that FIR circuit 16 knows the amount by which to shift a first instance of the first digital signal for processing with the coefficients. FIR circuit 16 may be in communication with phase accumulator 12 to notify phase accumulator 12 when it finishes processing the first digital signal at a 0° phase shift. Thereafter, phase accumulator 12 uses the resampling multiple and the second phase, 90°, to access the LUT, to obtain a different set of coefficients 30 for the resampling multiple of four and phase of 90°, and to configure FIR circuit 16 with that set of coefficients for the 90° phase shift. Phase accumulator 12 also provides FIR circuit 16 with information representing the phase of 90° so that FIR circuit 16 knows the amount by which to shift the second instance of the first digital signal for processing with the coefficients. Thereafter, phase accumulator 12 uses the resampling multiple and the third phase, 180°, to access the LUT, to obtain a different set of coefficients 30 for the resampling multiple of four and phase of 180°, and to configure FIR circuit 16 with that set of coefficients for the 180° phase shift. Phase accumulator 12 also provides FIR circuit 16 with information representing the phase of 180° so that FIR circuit 16 knows the amount by which to shift the third instance of the first digital signal for processing with the coefficients. Finally, for this example, phase accumulator 12 uses the resampling multiple and the second phase, 270°, to access the LUT, to obtain a different set of coefficients 30 for the resampling multiple of four and phase of 270°, and to configure FIR circuit 16 with that set of coefficients for the 270° phase shift. Phase accumulator 12 also provides FIR circuit 16 with information representing the phase of 270° so that FIR circuit 16 knows the amount by which to shift the fourth instance of the first digital signal for processing with the coefficients. The values presented in this example are for illustration only; any appropriate values may be used, as explained herein.

In some implementations, the coefficients in LUT 21 may be a subset of the coefficients needed for a given resampling process. Phase accumulator 12 may obtain the missing coefficients by performing an interpolation using the subset of coefficients. For example, a polynomial interpolation of the type described herein may be used to obtain a complete set of coefficients from those in the LUT.

In the preceding example where the resampling multiple is four, the sum of the values corresponding the phases produces an even number. In some cases, however, the accumulated sum of the values can cause errors in the resampling process. For example, in some cases, such as where the resampling multiple is a non-integer, the values corresponding to the phases may have multiple digits, such as 0.1231. The LUT, however, may limit all values to a predefined number of digits (e.g., four) such that, in this example, the LUT will have an associated value of 0.123 with corresponding coefficients. Phase accumulator includes a coarse sum circuit 31 that maintains the sum of values based on this predefined number of digits. So, each value is a truncated version of a number, with that the number containing digits that are not in each value.

Over time, as the values are accumulated by coarse sum circuit 31, an error may result from failure to account for all digits in the value in the sum produced by coarse sum circuit 31. In the preceding example, this error may result from failure to account the underlined number in 0.123<u>1</u>. As a result of this accumulation error, over time, the wrong value and coefficients may be applied to FIR circuit 16.

Phase accumulator 12 addresses this potential error by including a fine sum circuit 32 to maintain a "fine" sum using a greater number of digits than the sum produced by the coarse sum circuit. The number of digits used by the fine sum circuit may be all digits for the values or, where that is not possible, a predefined number of digits that is greater than the number of digits used by the coarse sum circuit. Due to the unaccounted—for digit(s), the accumulated sum produced by the coarse sum circuit may be incorrect at every $M^{th}$ sum, where M is an integer greater than one. To address this, phase accumulator 12 tracks the error, which is the difference between the sum produced by the coarse sum circuit and the fine sum circuit and, at every $M^{th}$ sum, phase accumulator 12 adds that error into the sum produced by the coarse sum circuit. This error correction may reduce the chances that that the incorrect coefficients will be obtained and applied to FIR circuit 16.

In the preceding example, coarse sum circuit 31 may produce sums using four digits (e.g., 0.123); however, fine sum circuit may produce sums using five digits (e.g., 0.1231). In this example, due to the unaccounted-for digit (e.g., the underlined digit in 0.123<u>1</u>), the accumulated value will be incorrect at every $10^{th}$ sum. This is because the underlined digit is unaccounted for by the coarse sum circuit. Accordingly, phase accumulator 12 adds the error caused by the unaccounted-for digit into the accumulated sum produced by coarse sum circuit 31 at every $10^{th}$ sum, while still truncating the resulting sum to a three-digit value used for the LUT. The resulting error-corrected sum is then used by phase accumulator to obtain the next set of coefficients for FIR circuit 16.

in some implementations, errors such as those described above may be pre-calculated and stored in a second LUT (not shown). In such implementations, a fine sum circuit may not be needed. At each $M^{th}$ sum, phase accumulator 12 may retrieve an error for the corresponding value and sampling rate from this second LUT, and apply the error as described herein.

Figure 2:
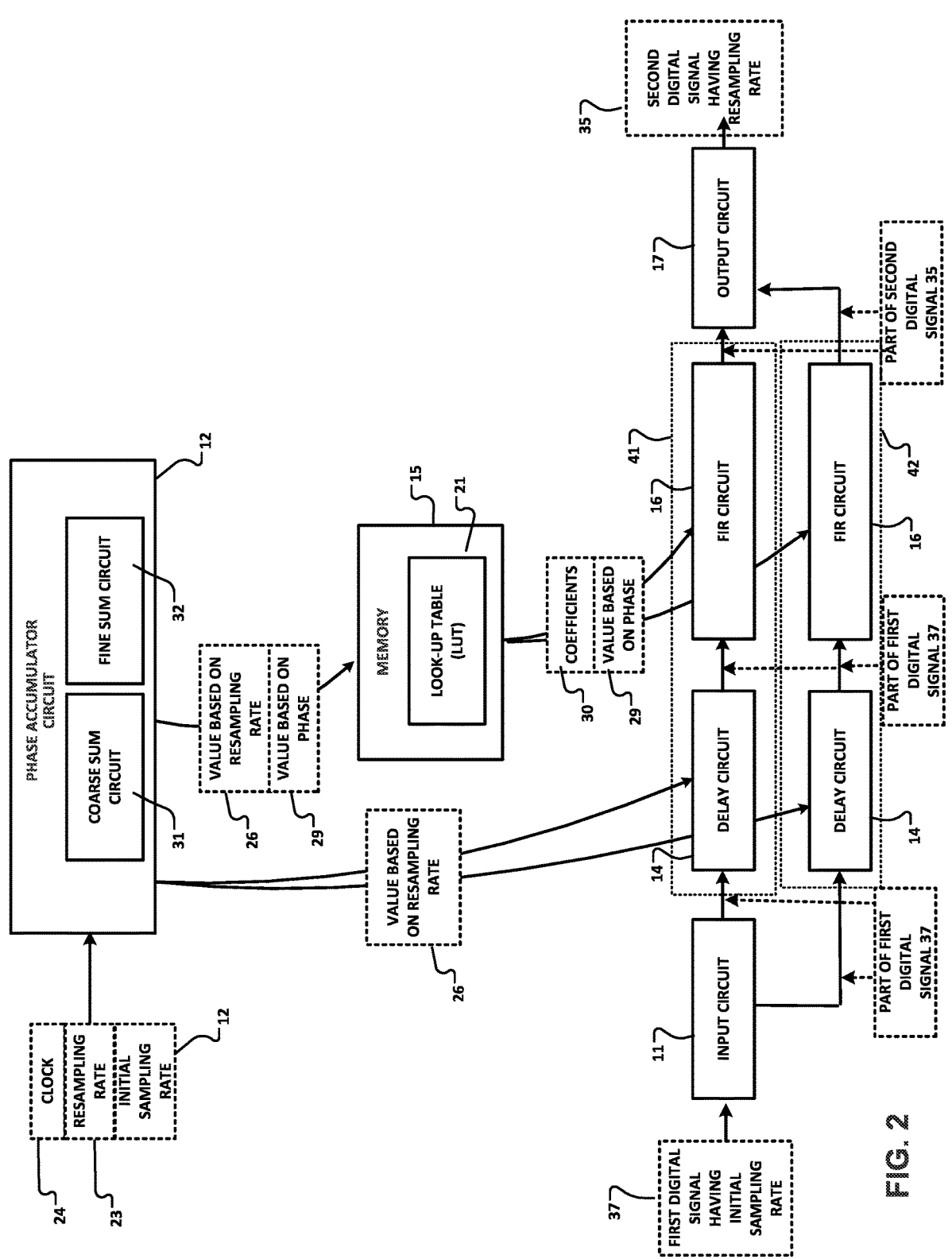
FIG. 2 is a block diagram of an example resampler circuit that employs parallel processing.
Figure 3:
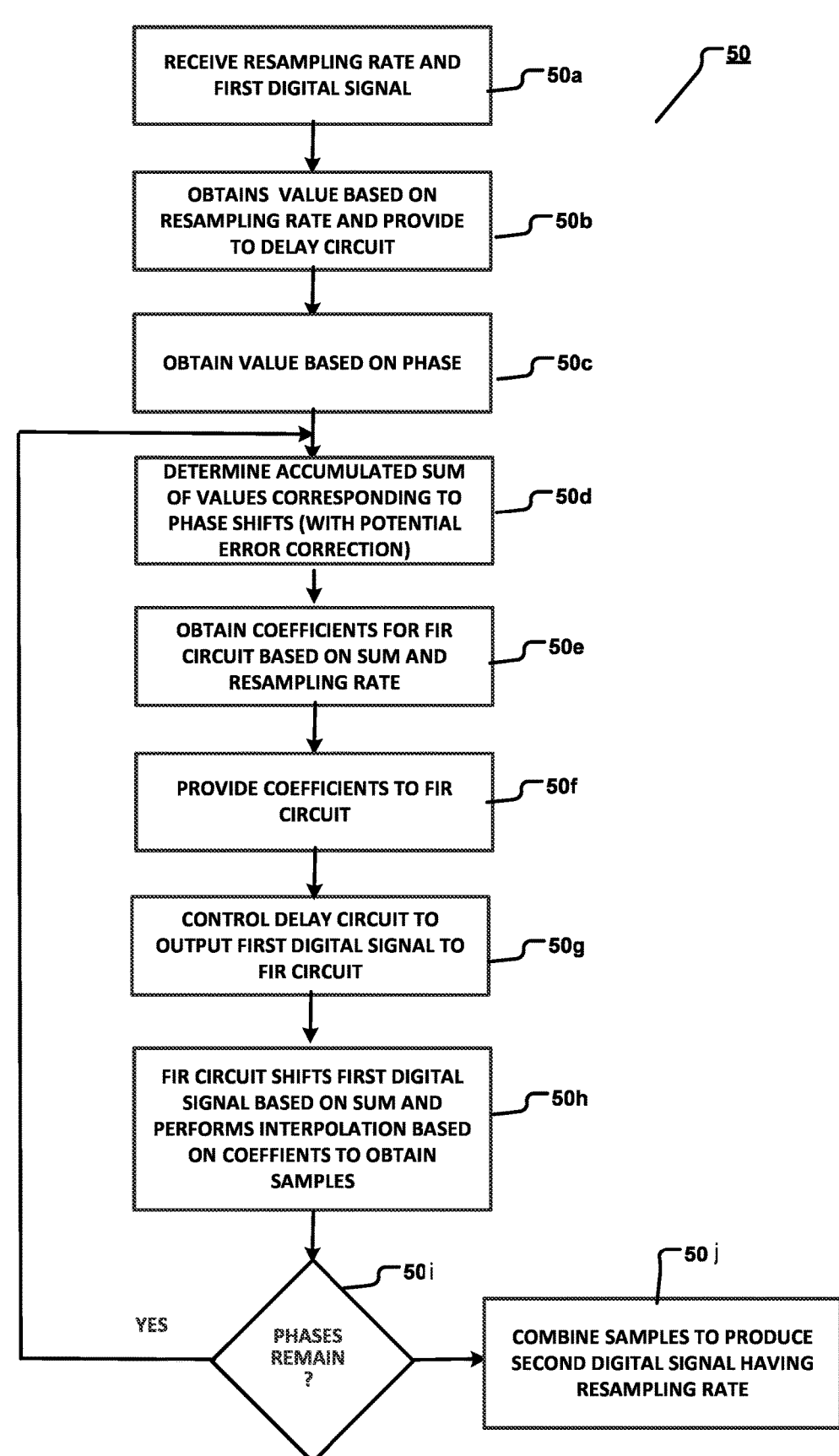
FIG. 3 is a flowchart showing example operations included in processes for performing resampling using the example circuits of FIG. 1 or 2.

In some implementations, as shown in FIG. 3, an example resampler 40 may include components 41, 42 that operate in parallel. Parallel operation may be separate processing or may have a temporal component, such as all or part of the processing performed by different components 41, 42 at least partly overlapping in time (e.g., all or part of the processing may be concurrent). The circuitry of resampler 40 may have the same or similar structure and function as similarly labeled circuitry of resampler 10 of FIG. 1. Although two sets of components 41, 42 are shown in FIG. 2, more than two sets of components may operate in parallel. In this example, components 41, 42 may be configured to operate in parallel, with phase accumulator 12 and LUT 21 servicing—for example, providing the necessary data and information for—each set of components operating in parallel. Parallel operation may be used in cases where the resampler operates at a lower clock rate than the clock rate at which the data is received. For example, if the resampler runs using a 300 megahertz (MHz) clock and the first digital signal is received at a rate of 2400 MHz, then input circuit 11 may break the first digital signal into multiple parts—in this example, eight parts—then process those parts in parallel to produce parts of a second signal having the resampling rate. More specifically, in the case of parallel processing, delay circuits 14 receive respective parts of the first digital signal from input circuit 11 and provide those parts to respective FIR circuits 16. FIR circuits 16 each processes its corresponding part of the first digital signal in parallel. Output circuit 17 may receive, from FIR circuit 16, the resulting parts of a second digital signal have the resampling rate and combines those parts to produce the second digital signal 35 having the resampling rate.

FIG. 3 shows example operations included in an example process 50 for converting a first digital signal having an initial (first) sampling rate into a second digital signal having resampling (second) rate that is different from the initial (first) sampling rate. Process 50 may be performed, in whole or part, using resampler 10 of FIG. 1 or using resampler 40 having parallel branches as shown in FIG. 2.

Process 50 receives (50a) the resampling rate and the first digital signal. As shown in FIG. 1, input circuit 11 receives the first digital signal 37 and phase accumulator circuit 12 receives the initial sampling rate 22 and the resampling rate 23. The first digital signal may represent any appropriate signals such as, but not limited to, a WiFi or 5G signal. The resampling rate may be provided by a user or by a computer program or another circuit. The initial sampling rate may be determined by phase accumulator 12 by monitoring first digital signal at input circuit 11 or the initial sampling rate may be provided by a user or by a computer program or another circuit.

Process 50 obtains (50b) a value 26 based on the resampling rate, such as the resampling multiple described above. For example, accumulator 12 may be determine the multiple by which the initial sampling rate is to be changed to obtain the resampling rate. In a non-limiting example presented above, this value is four. This value is provided to delay circuit 14. Delay circuit 14 outputs first digital signal 37 to FIR circuit 16 a number of times corresponding to this value; for example, four times. For example, in this implementation, if the sampling rate if the first digital signal is to be increased by a factor of four, the same first digital signal 37 may be processed four times by FIR circuit 16 to obtain four times as many samples.

Process 50 obtains (50c) phases and/or values based on those phases. The phases and/or values based thereon may be determined based on the resampling rate and, more particularly, based on the resampling multiple. For example, if the resampling multiple is four, then there are four phases, as described above, by which FIR circuit 16 shifts each respective instance of the digital signal that it receives from delay circuit 14. Accumulator 12 may determine each of these four phases by summing a value, such as 0.25 or 90°, each time the FIR circuit is to process an instance of the first digital signal. The operation of FIR circuit 16 is also described in more detail below.

In this regard, process 50 determines (50d) an accumulated sum of values (e.g., starting with 0 and adding 0.25 or 90° above), which corresponds to a phase shift to be performed by FIR circuit 16 on an instance of first digital signal 37 output to FIR circuit 16. As noted above, accumulator circuit 12 may determine this sum using coarse sum circuit 31 and/or fine sum circuit 32. As explained above, an error correction may be added to every $M^{th}$ sum, which is based on a sum maintained by fine sum circuit 32.

Process 50 obtains (50e) coefficients from LUT 21 for FIR circuit 15 based on the accumulated sum (which corresponds to a current phase to be processed by FIR circuit 16) 29 and a resampling rate or a value 26 based on that rate, such as the resampling multiple. For example, accumulator 12 may access LUT 21 to obtain coefficients for the resampling multiple and the current phase. In the preceding example, initially, accumulator accesses LUT 21 to obtain coefficients for a resampling multiple of four and a current phase of 0° corresponding to an accumulated value of 0.

Process 50 provides (50f) the coefficients 30 and the sum or phase to FIR circuit 16. For example, accumulator 12 programs the coefficients as taps of FIR circuit 16. Accumulator 12 controls (50g) delay circuit 14 to output first digital signal 37 to FIR circuit 16. In the example where the resampling multiple is four, this is the first of four times that that delay circuit 14 outputs first digital signals 37 to FIR circuit 16.

FIR circuit 16 (50h) shifts the received first digital signal by the received phase and performs interpolation on the first digital signal based on the coefficients to obtain additional and/or substitute samples using polynomial interpolation as described previously. FIR circuit 16 may provide, to output circuit 17, the substitute and/or additional samples that it determined. FIR circuit 16 may also notify accumulator 12 when is has completed processing. Accumulator 12 determines (50i) whether all phases have been processed. If not, operations 50d to 50h are repeated using the same first digital signal, a new accumulated sum/phase, and different coefficients. Operations 50d to 50h may be repeated until all phases determined by accumulator 12 have been processed. Thereafter, output circuit 17 combines (50j) samples received from FIR circuit 15 to produce second digital signal 35 having the resampling rate.

Implementations that employ parallel processing, such as example resampler 40 of FIG. 2 operate in the same manner as described above, except that input circuit 11 separates the first digital signal into part and sends the parts to respective components 40, 41 for separate parallel processing. Thereafter, those parts are combined by output circuit 17.

Resampling using the example resampler of FIG. 1 or 2 and process 50 may have advantages over existing/prior resampling techniques. More specifically, in at least some existing/prior resampling techniques, resamplers are hard-coded, making it difficult to achieve a resampling multiple other than those that are hard-coded into the resamplers. By way of example, a first digital signal is to be resampled to generate a second digital signal having a sampling rate that is 1.5 times the sampling rate of the first digital signal. Using existing/prior resampling techniques, the first digital signal would need to be upsampled by a factor of three using a first resampler hard-coded to upsample by a factor of three. Then, the resulting upsampled digital signal (by the factor of three) would need to be downsampled by a factor of two using a second resampler that is hard-coded to downsample by a factor of two. By contrast, the example resampler and techniques described herein enable the FIR circuit 16 (or FIR circuits 16) to be configured with coefficients to produce, directly from the first digital signal, a second digital signal having a sampling rate that is 1.5 times the sampling rate of the first digital signal.

Other advantages of the example resampler of FIG. 1 or 2 and process 50 may include one or more of the following. There may be no need for spurious rejection filter after the resampler. There are no limitations on the resolution of the resampling rate. The resampler works for both upsampling and downsampling. Down-sampling may include an anti-aliasing filter at the input to the resampler if the spectrum of the first digital signal contains more than a predefined amount of noise. There are no limitations on signal band-width. Higher bandwidth signals may be processed by the resampler by increasing the number of coefficients programmed into FIR circuit(s) 16. Increasing the number of coefficients in the LUT may lower phase jitter that creates spurious rejection. There are no limitations on how many resampler components can run in parallel to support sampling rates that may be higher than, e.g., a core clock rate in an FPGA. The DDS integer part may generate an address for each resampler component running in parallel. Sampling rates for a digital-to-analog converter (DAC) and waveforms are not locked; e.g., it may be beneficial to run a DAC at as high frequency as possible to simplify analog filters and increase available bandwidth. There may be no need to software resample a waveform from its base rates. A change in sampling rate can be relatively fast, with few lost samples matching the length of the FIR. This makes a frame trigger simpler to implement with a consistent performance The resampler adds a new option for a user to add clock-rate-offsets to waveforms. This allows for test of clock-rate recovery in a demodulator. The sampling rate and carrier frequency may emulate device under test (DUT) reference offsets at different carrier frequencies.

All or part of the example systems and example processes described in this specification and their various modifications may be configured or controlled at least in part by one or more computers such as control system that may be separate from or part of accumulator circuit 12, using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a circuit, part, subroutine, or other unit suitable for use in a computing environment. A computer program can be deployed to be executed on one computer or on multiple computers at one site or distributed across multiple sites and interconnected by a network.

In some implementations, the example resamplers described herein may be implemented on a test system, such as automatic test equipment (ATE) used to test a DUT, such as a WiFi or 5G circuit having a required sampling rate.

Actions associated with configuring or controlling the resampler, the test system, and processes described herein can be performed by one or more programmable processors executing one or more computer programs to control or to perform all or some of the operations described herein. All or part of the resampler, the test system, and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

In the description and claims provided herein, the adjectives "first", "second", "third", and the like do not designate priority or order unless context suggests otherwise. Instead, these adjectives may be used solely to differentiate the nouns that they modify.

Any mechanical or electrical connection herein may include a direct physical connection or an indirect physical connection that includes one or more intervening components. A connection between two electrically conductive components is an electrical connection unless context suggests otherwise.

Elements of different implementations described may be combined to form other implementations not specifically set forth previously. Elements may be left out of the systems and processes described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system for converting a first digital signal having a first sampling rate into a second digital signal having a second sampling rate that is different from the first sampling rate, the system comprising:

an input circuit to receive the first digital signal at the first sampling rate;

a fractional finite impulse response (FIR) circuit configured to shift the first digital signal by a value corresponding to coefficients of the FIR circuit, with the value being based on an integer value or a non-integer value;

memory to store the coefficients for the FIR circuit; and processing circuitry to receive information corresponding to the second sampling rate, to obtain the value based on the information, to obtain the coefficients from the memory based on the value, and to provide the coefficients to the FIR circuit;

wherein the FIR circuit is configured to convert the first digital signal to the second digital signal by shifting the first digital signal based on the value and by performing processing on the first digital signal as shifted based on the coefficients to convert the first digital signal into the second digital signal.

2. The system of claim 1, wherein the processing performed by the FIR circuit on the first digital signal comprises interpolation.

3. The system of claim 1, wherein the processing circuitry comprises a phase accumulator, the phase accumulator being configured to determine multiple values, including the value, based on the information, each of the multiple values corresponding to coefficients of the FIR circuit; and wherein the FIR circuit is configured to convert the first digital signal to the second digital signal by shifting the first digital signal based on each of multiple values and by performing processing on the first digital signal as shifted based on coefficients corresponding to each of the multiple values to convert the first digital signal into the second digital signal.

4. The system of claim 3, wherein the phase accumulator is configured to obtain values after a first value by summing multiple preceding ones of the values;

wherein each value is a truncated version of a number, the number containing digits that are not in each value; and wherein the processing circuitry is configured to add an error to at least one of the values after the first value based on digits in the number.

5. The system of claim 4, wherein the error is added to each $N^{th}$ value, where N is an integer greater than one.

6. The system of claim 1, wherein the memory comprises a look-up table (LUT), the LUT for storing the coefficients, the coefficients being among sets of coefficients stored in the memory to implement different sampling rates.

7. The system of claim 6, wherein the coefficients comprises a set of coefficients; and wherein a number of coefficients in the set is based on the second sampling rate.

8. The system of claim 1, further comprising a circuit configured to output the first digital signal to the FIR circuit based on the information.

9. The system of claim 1, further comprising multiple FIR circuits, including the FIR circuit, the multiple FIR circuits being configured to operate in parallel.

10. The system of claim 1, wherein the first sampling rate is less than the second sampling rate.

11. The system of claim 1, wherein the second sampling rate is less than the first sampling rate.

12. The system of claim 1, wherein the coefficients comprise a set of coefficients; and wherein coefficients from the set are obtained, and provided to the FIR circuit, based on the second sampling rate.

13. A field-programmable gate array (FPGA) comprising the system of claim 1.

14. An application-specific integrated circuit comprising the system of claim 1.

15. A method for converting a first digital signal having a first sampling rate into a second digital signal having a second sampling rate that is different from the first sampling rate, the method comprising:

receiving the first digital signal at the first sampling rate;

receiving information corresponding to the second sampling rate;

obtaining a value based on the information, with the value being based on an integer value or a non-integer value;

obtaining coefficients based on the value; and a fractional finite impulse response (FIR) circuit shifting the first digital signal based on the value, and performing processing on the first digital signal as shifted based on the coefficients to convert the first digital signal into the second digital signal.

16. The method of claim 15, wherein the processing performed by the FIR circuit on the digital signal comprises interpolation.

17. The method of claim 15, wherein obtaining the value comprises determining multiple values, including the value, using a phase accumulator based on the information, each of the multiple values corresponding coefficients of the FIR circuit; and wherein the FIR circuit shifts the first digital signal based on each of multiple values and performs processing on the first digital signal as shifted based on coefficients corresponding to each of the multiple values to convert the first digital signal into the second digital signal.

18. The method of claim 17, wherein the phase accumulator obtains values after a first value by summing multiple preceding ones of the values;

wherein each value is a truncated version of a number, the number containing digits that are not in each value; and wherein the method comprises adding an error to at least one of the values after the first value based on digits in the number.

19. The method of claim 18, wherein the error is added to each $N^{th}$ value, where N is an integer greater than one.

20. The method of claim 15, wherein the coefficients are obtained from memory storing coefficients.

21. The method of claim 15, further comprising causing the first digital signal to be output to the FIR circuit based on the information.

22. The method of claim 15, further comprising multiple FIR circuits, including the FIR circuit, the multiple FIR circuits operating in parallel.

23. The method of claim 15, wherein the first sampling rate is less than the second sampling rate.

24. The method of claim 15, wherein the second sampling rate is less than the first sampling rate.

25. The method of claim 15, wherein the coefficients comprise a set of coefficients; and wherein coefficients from the set are obtained, and provided to the FIR circuit, based on the second sampling rate.

* * * * *